(12) United States Patent
Kris et al.

(10) Patent No.: US 7,646,808 B2
(45) Date of Patent: Jan. 12, 2010

(54) ALLOWING IMMEDIATE UPDATE OF PULSE WIDTH MODULATION VALUES

(75) Inventors: Bryan Kris, Phoenix, AZ (US); Steve Bradley, Phoenx, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 554 days.

(21) Appl. No.: 11/620,499

(22) Filed: Jan. 5, 2007

(65) Prior Publication Data
US 2007/0230559 A1    Oct. 4, 2007

Related U.S. Application Data

(60) Provisional application No. 60/788,964, filed on Apr. 4, 2006.

(51) Int. Cl.
*H03K 9/08* (2006.01)
(52) U.S. Cl. ...................................... 375/238
(58) Field of Classification Search ................. 375/238, 375/295, 316, 354
See application file for complete search history.

(56) References Cited

U.S. PATENT DOCUMENTS

| | | | | |
|---|---|---|---|---|
| 6,545,882 B2* | 4/2003 | Yang | ........................ | 363/21.08 |
| 6,870,142 B2* | 3/2005 | Hada et al. | ................... | 219/494 |
| 6,937,084 B2* | 8/2005 | Bowling | ..................... | 327/393 |

OTHER PUBLICATIONS

International Search Report for PCT/US2007/065766 mailed Oct. 18, 2007.

* cited by examiner

*Primary Examiner*—Khai Tran
(74) *Attorney, Agent, or Firm*—King & Spalding L.L.P.

(57) ABSTRACT

A pulse width modulation (PWM) generator having asynchronous updating of its PWM duty cycle and/or period values allows immediate correction for the new PWM duty cycle and/or period values instead of waiting until the end of a PWM period to accept the new duty cycle and/or period values. This reduces the latency in a control loop when responding to changing system status, e.g., changes in PWM duty cycle. Also the PWM duty cycle is prevented from "running away" (e.g., missing a PWM cycle) if the PWM duty cycle timer/counter has advanced beyond an updated duty-cycle maximum value.

13 Claims, 4 Drawing Sheets

(prior technology)

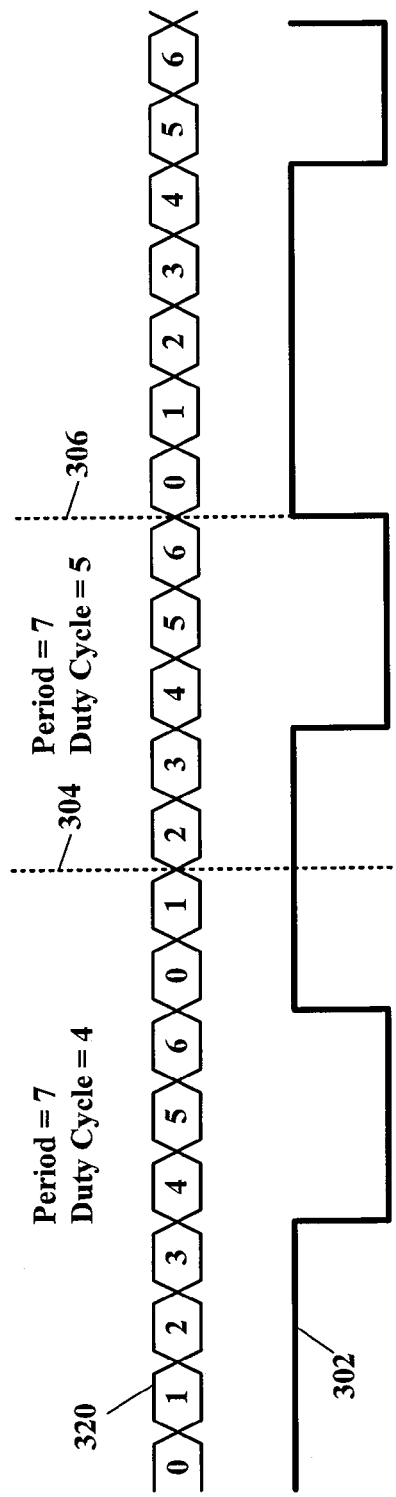
*Figure 3* (prior technology)
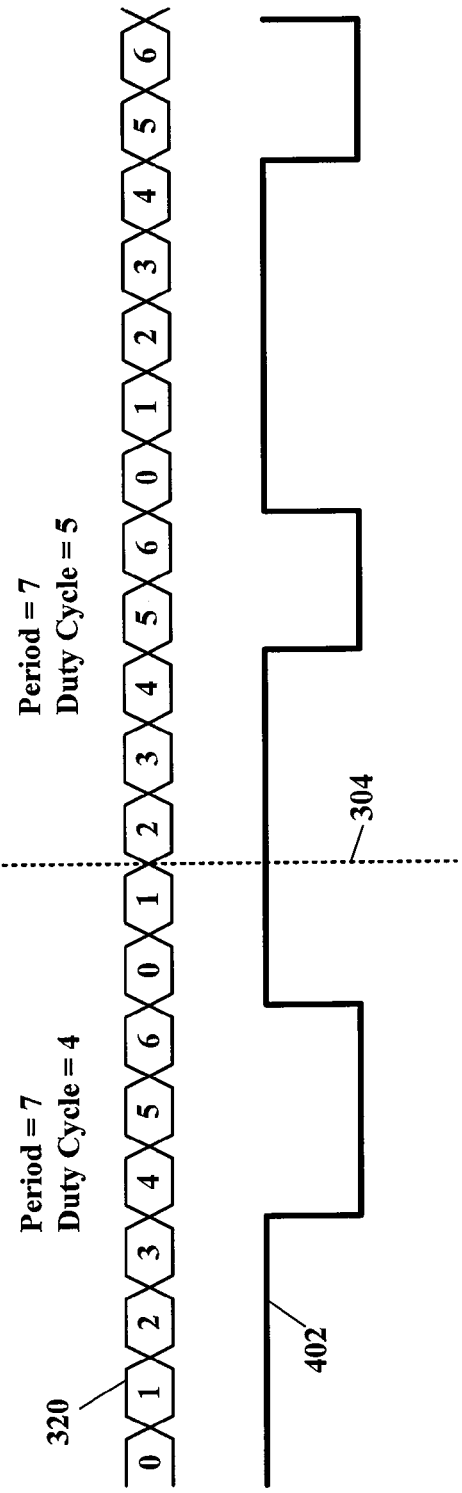
*Figure 4*

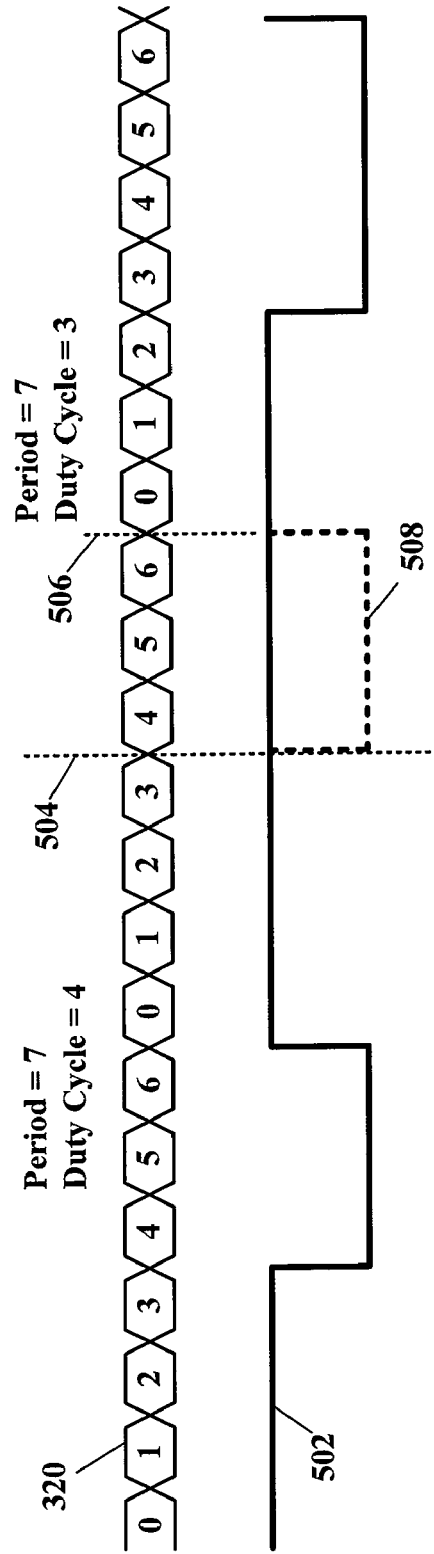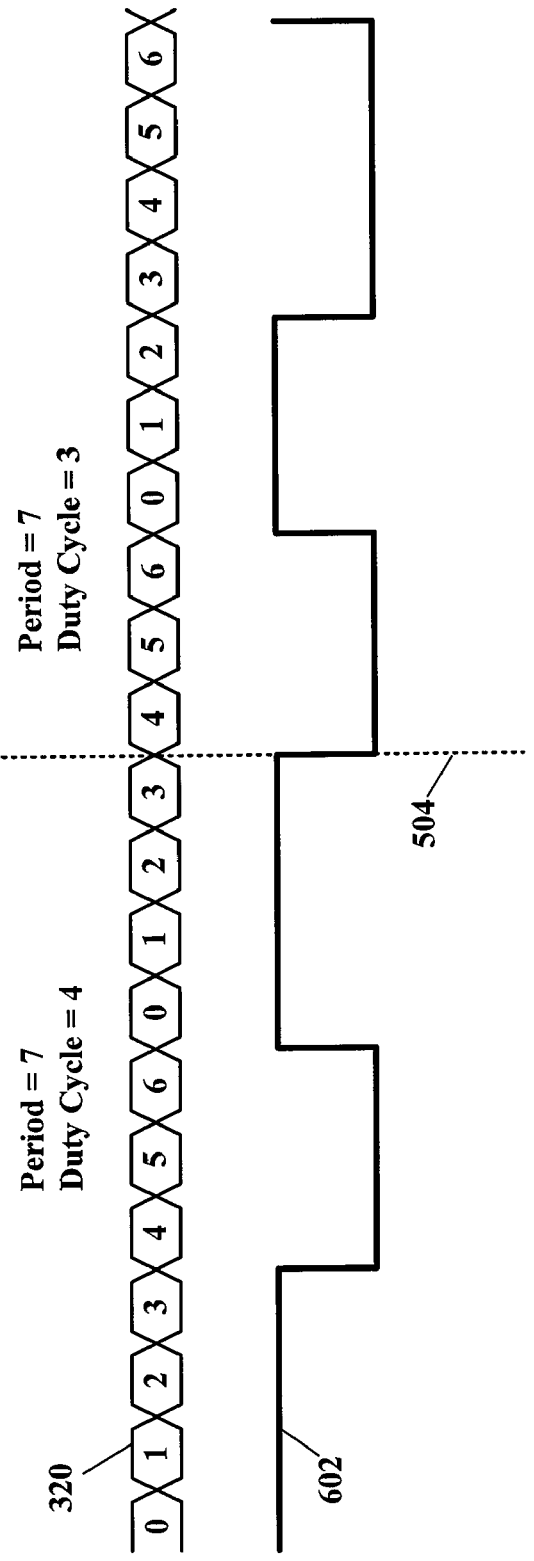
Figure 5 (prior technology)
Figure 6

ALLOWING IMMEDIATE UPDATE OF PULSE WIDTH MODULATION VALUES

RELATED PATENT APPLICATION

This application claims priority to commonly owned U.S. Provisional Patent Application Ser. No. 60/788,964; filed Apr. 4, 2006; entitled "Allowing Immediate Update of PWM Duty Cycle Value (Not Limited to Being on PWM Cycle Boundary)," by Bryan Kris and Steve Bradley; which is hereby incorporated by reference herein for all purposes.

TECHNICAL FIELD

The present disclosure relates to digital devices having digital pulse width modulation (PWM) capabilities, and more particularly, to a digital device allowing immediate update of changes in PWM duty cycle and/or period values.

BACKGROUND

The ability to provide immediate (asynchronous) update of PWM duty cycle values is very important in Switch Mode Power Supplies (SMPS) because the control loop stability and performance is inversely proportional to the control loop "lag." The "lag" is the time from the acquisition of the feedback information until new stimulus is provided to the system. Present technology PWM generators may incur a delay from the calculation of new stimulus value (duty cycle) till the PWM can be updated at the next PWM boundary (synchronous update). This delay may be caused (1) if a new smaller duty cycle value is programmed into the PWM generator, (2) if the PWM cycle counter has advanced beyond the new duty cycle value, and (3) if an EQUAL comparison is made between the duty cycle value and the PWM cycle count value. It is also possible for a PWM cycle counter to "MISS" the maximum duty cycle value and remain "ON" until the PWM counter reaches its hardware limitation and "rolls over" from a maximum count to a zero count, thus beginning the next PWM cycle. This "roll over" time may be multiples of the desired PWM cycle duration and may cause serious functional problems when controlling a SMPS.

SUMMARY

Therefore there is a need for a way to overcome the above-identified problems as well as other shortcomings and deficiencies of existing technologies by providing a digital PWM generation feature in a digital device, e.g., microprocessor, microcontroller, digital signal processor (DSP), programmable logic array (PLA), application specific integrated circuit (ASIC) and the like, with features that would be useful and advantageous for operation and control of advanced switching power supply systems, e.g., Switch Mode Power Supply (SMPS) systems.

According to a specific example embodiment of this disclosure, an apparatus for generating pulse width modulation (PWM) may comprise: a timer/counter; a period register; a duty cycle register; a first comparator having a first input coupled to the period register, a second input coupled to the timer/counter and an output coupled to a reset of the timer/counter such that a count value of the timer/counter resets when the count value is equal to or greater than a period value stored in the period register; and a second comparator having a first input coupled to the duty cycle register, a second input coupled to the timer/counter and an output generating a PWM signal, wherein the PWM signal is at a first logic level when the count value is less than a duty cycle value stored in the duty cycle register, otherwise the PWM signal at the output of the second comparator is at a second logic level.

According to another specific example embodiment of this disclosure, a method for generating pulse width modulation (PWM) may comprise the steps of: providing a period value; providing a duty cycle value; incrementing a time count value; comparing the time count value with the period value such that when the time count value is equal to or greater than the period value the time count value is reset to a first time count value; and comparing the time count value with the duty cycle value such that when the time count value is less than the duty cycle value then a PWM signal is at a first logic level, otherwise the PWM signal is at a second logic level.

BRIEF DESCRIPTION OF THE DRAWINGS

A more complete understanding of the present disclosure thereof may be acquired by referring to the following description taken in conjunction with the accompanying drawings wherein:

FIG. 3 illustrates a schematic timing diagram of a PWM signal from the PWM generator illustrated in FIG. 1;

FIG. 4 illustrates a schematic timing diagram of a PWM signal from the specific exemplary embodiment of the PWM generator illustrated in FIG. 2, according to the specific example embodiment of this disclosure;

FIG. 5 illustrates another schematic timing diagram of a PWM signal from the PWM generator illustrated in FIG. 1;

FIG. 6 illustrates another schematic timing diagram of a PWM signal from the specific exemplary embodiment of the PWM generator illustrated in FIG. 2, according to the specific example embodiment of this disclosure.

Figure 1:
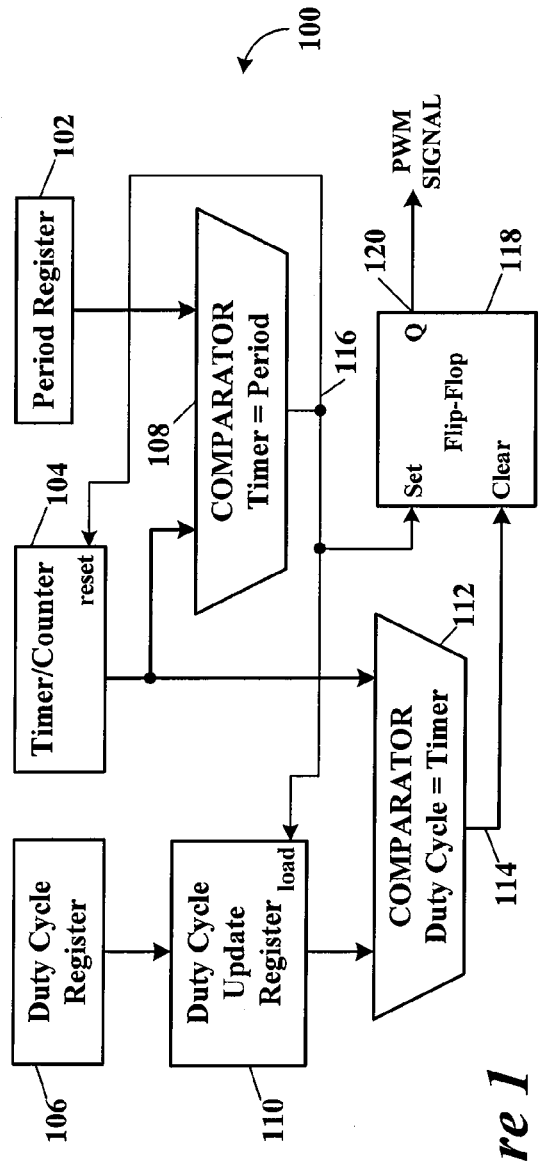
FIG. 1 illustrates a schematic block diagram of a prior technology pulse width modulation (PWM) generator.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawings, the details of specific example embodiments are schematically illustrated. Like elements in the drawings will be represented by like numbers, and similar elements will be represented by like numbers with a different lower case letter suffix.

Referring to FIG. 1, depicted is a schematic block diagram of a prior technology pulse width modulation (PWM) generator. A prior technology PWM generator, generally represented by the numeral 100, may comprise a period register 102, a timer/counter 104, a duty cycle register 106, a timer/period comparator 108, a duty cycle update register 110, a duty cycle/timer comparator 112, and a PWM flip-flop 118.

The period register 102 may be loaded with the desired period and the duty cycle register 106 may be loaded with the desired duty cycle for the PWM signal 114 (see FIGS. 3 and 5). The timer/counter 104 incrementally counts until its count value is equal to the period value stored in the period register 102. When both are equal, the PWM flip-flop 118 is set (Q-output goes high or logic "1"), then timer/counter 104 is reset back to zero and begins incrementally counting up again until its count and the period value are equal as determined by the comparator 108. Whenever the count value from the timer counter 104 is equal to the period value stored in the period register 102, the duty cycle update register 110 will be loaded with the desired duty cycle value stored in the duty cycle register 106. The duty cycle/timer comparator 112 determines when the count from the timer/counter 104 equals the PWM duty cycle value stored in the duty cycle update register 110, and when equal an output 114 from the duty cycle update register 110 clears the PWM flip-flop 118 (Q-output goes low or logic "0") thereby generating a PWM signal at output 120 of the PWM flip-flop 118. The comparator 112 and the flip-flop 118 are used to force duty cycle updates and PWM cycle boundaries (completed periods) to avoid potential errors in the PWM signal.

Figure 2:
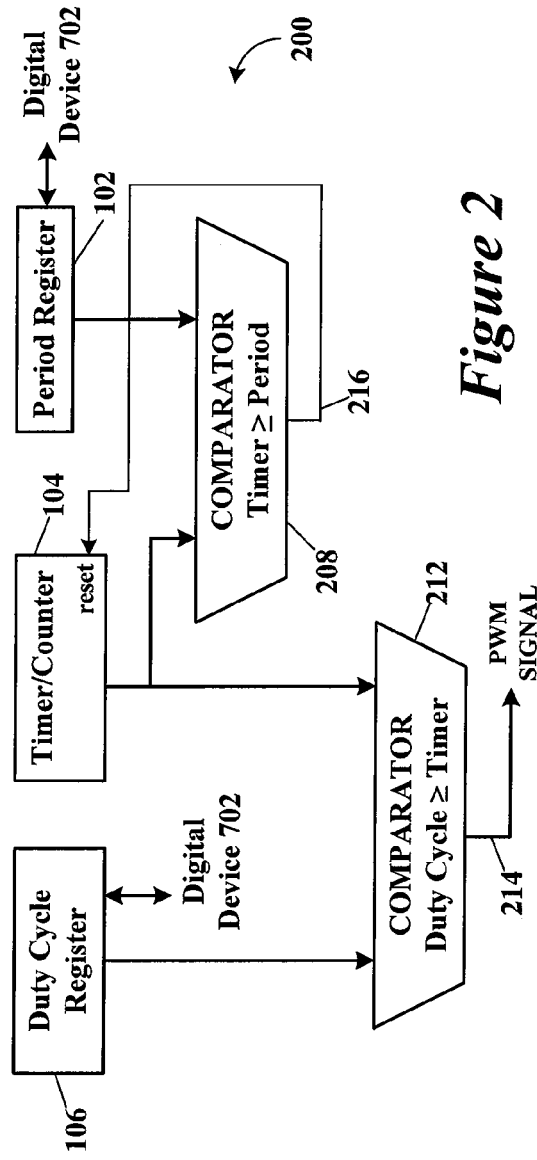
FIG. 2 illustrates a schematic block diagram of a PWM generator that allows immediate update of pulse width modulation duty cycle and/or period values, according to a specific example embodiment of this disclosure.

Referring to FIG. 2, depicted is a schematic block diagram of a PWM generator that allows immediate update of pulse width modulation duty cycle and/or period values, according to a specific example embodiment of this disclosure. A PWM generator, generally represented by the numeral 200, may comprise a period register 102, a timer/counter 104, a duty cycle register 106, a timer/period comparator 208, and a duty cycle/timer comparator 212. The period register 102 may be loaded with the desired period and the duty cycle register 106 may be loaded with a desired duty cycle for the PWM signal 214 (see FIGS. 4 and 6). The timer/counter 104 incrementally counts until its count value is equal to or greater than the period value stored in the period register 102, then the timer/counter 104 resets back to zero and begins incrementally counting up again. By having an equal to or greater than comparison feature in the comparator 208, a PWM period change may be immediately updated and not have to wait for completion of a present PWM period. This is especially important when the PWM period is shortened.

The duty cycle/timer comparator 212 generates the PWM signal at its output 214 whenever the value from the timer/counter 104 is less than the value in the duty cycle register 106. This feature allows an immediate duty cycle update (asynchronous updating) to the new PWM duty cycle values instead of waiting until the end of a PWM period to accept the new duty cycle values. This reduces the latency in a control loop when responding to changing system status, e.g., changes in PWM duty cycle, and prevents PWM "run away" (e.g., missing a PWM cycle) if the PWM duty cycle timer/counter 104 has advanced beyond the updated duty-cycle maximum value. Note also that a duty cycle update register (register 110 of FIG. 1) is not required according to the teachings of this disclosure.

It is contemplated and within the scope of this disclosure that logic of a digital device 702 (see FIG. 7) may be used to write and/or read duty cycle values to/from the duty cycle register 106, and to write and/or read period values to/from the period register 102. The PWM generator 200 may also be part of (integral with) the logic circuits of the digital device 702.

Referring to FIG. 3, depicted is a schematic timing diagram of a PWM signal from the PWM generator illustrated in FIG. 1. On the left portion of FIG. 3, the PWM signal waveform 302 has a period=7 and a duty cycle=4. At time 304 the duty cycle is changed (increased) to 5 but the PWM signal waveform 302 does not assume the new duty cycle of 5 until the present duty cycle=4 is completed at the end of the current period time 306. Thus significant delay has been introduced from the time the duty cycle was changed from 4 to 5 and the actual PWM signal 302 implementation of this new duty cycle. Clock waveforms 320 generally represent the PWM generator clocks used in determining the PWM periods and duty cycles.

Referring to FIG. 4, depicted is a schematic timing diagram of a PWM signal from the specific exemplary embodiment of the PWM generator illustrated in FIG. 2, according to the specific example embodiment of this disclosure. On the left portion of FIG. 4, the PWM signal waveform 402 has a period=7 and a duty cycle=4. At time 304 when the duty cycle is changed to 5 the PWM signal waveform 402 immediately assumes the new duty cycle of 5. Thus there is substantially no delay from the time the duty cycle changes from 4 to 5 at time 304 and the actual PWM signal 402 waveform implementation of this new duty cycle.

Referring to FIG. 5, depicted is another schematic timing diagram of a PWM signal from the PWM generator illustrated in FIG. 1. On the left portion of FIG. 5, the PWM signal waveform 502 has a period=7 and a duty cycle=4. At time 504 the duty cycle is changed (decreased) to 3 but the PWM signal waveform 502 does not assume the new duty cycle of 3 until the present the period(=7) has completed at the end of the time period indicated by time 506. In this example, the PWM duty cycle counter 106 has "MISSED" the maximum duty cycle value and remains "ON" until the counter 106 reaches its hardware limitation and "rolls over" from, e.g., FFFF to a zero count beginning at the next PWM period. This "roll over" time may be multiple desired PWM duty cycles and may cause serious functional control problems. In the example shown in FIG. 5 a PWM duty cycle 508 was lost (indicated by dashed lines between times 504 and 506.

Referring to FIG. 6, depicted is another schematic timing diagram of a PWM signal from the specific exemplary embodiment of the PWM generator illustrated in FIG. 2, according to the specific example embodiment of this disclosure. On the left portion of FIG. 6, the PWM signal waveform 602 has a period=7 and a duty cycle=4. At time 504 the duty cycle is changed (decreased) to 3 and the PWM signal waveform 502 assumes the new duty cycle of 3 immediately. At time 504 and thereafter (until the next duty cycle change) the PWM signal waveform 602 has a period=7 and a duty cycle=3. Thus, there is substantially no delay("lag time") from the time the duty cycle changes from 4 to 3 at time 504 and the actual PWM signal 602 waveform implementation of this new duty cycle. This allows immediate duty cycle reaction to a new (smaller) value thus preventing PWM "run away" (e.g., missing a PWM cycle) if the PWM duty cycle counter 104 has advanced beyond the updated duty-cycle max-value.

Figure 7:
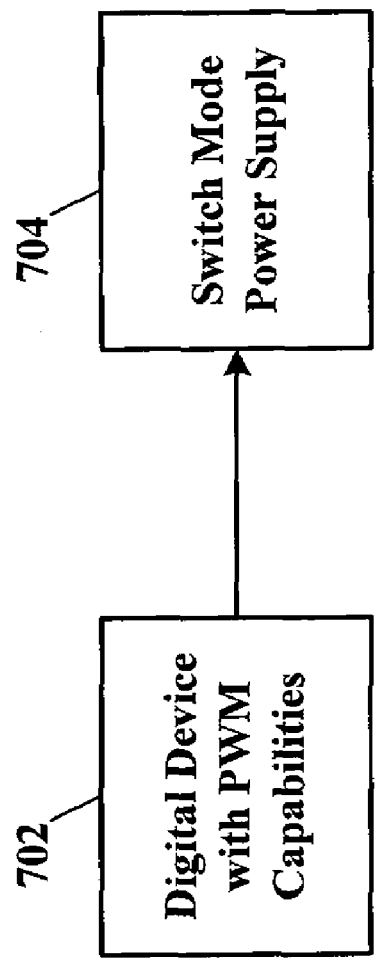
FIG. 7 illustrates a digital device having PWM generation capabilities coupled to a switch mode power supply, according to specific example embodiments of this disclosure.

Referring to FIG. 7, depicted is a digital device having PWM generation capabilities coupled to a switch mode power supply, according to specific example embodiments of this disclosure. A digital device 702, e.g., microprocessor, microcontroller, digital signal processor (DSP), programmable logic array (PLA), application specific integrated circuit (ASIC) and the like, may be coupled to a switch mode power supply 704, or any other system using PWM for control thereof. The duty cycle register 106 and/or the period register 102 (FIG. 2) may be loaded (and/or read) by the digital device 702.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. An apparatus for generating pulse width modulation (PWM), comprising:
   a timer/counter;
   a period register;
   a duty cycle register;
   a first comparator having a first input coupled to the period register, a second input coupled to the timer/counter and an output coupled to a reset of the timer/counter such that a count value of the timer/counter resets when the count value is equal to or greater than a period value stored in the period register; and
   a second comparator having a first input coupled to the duty cycle register, a second input coupled to the timer/counter and an output generating a PWM signal, wherein the PWM signal is at a first logic level when the count value is less than a duty cycle value stored in the duty cycle register, otherwise the PWM signal at the output of the second comparator is at a second logic level.

2. The apparatus according to claim 1, further comprising a digital device coupled to the period register and the duty cycle register.

3. The apparatus according to claim 2, wherein the digital device is selected from the group consisting of a microprocessor, microcontroller, digital signal processor (DSP), application specific integrated circuit (ASIC) and programmable logic array (PLA).

4. The apparatus according to claim 2, wherein the digital device writes the period value to the period register.

5. The apparatus according to claim 2, wherein the digital device writes the duty cycle value to the duty cycle register.

6. The apparatus according to claim 2, wherein the digital device reads the period value from the period register.

7. The apparatus according to claim 2, wherein the digital device reads the duty cycle value from the duty cycle register.

8. The method according to claim 1, wherein the first logic level is a logic "1" and the second logic level is a logic "0".

9. The method according to claim 1, wherein the first logic level is a logic "0" and the second logic level is a logic "1".

10. A method for generating pulse width modulation (PWM), said method comprising the steps of:
    providing a period value;
    providing a duty cycle value;
    incrementing a time count value;
    comparing the time count value with the period value such that when the time count value is equal to or greater than the period value the time count value is reset to a first time count value; and
    comparing the time count value with the duty cycle value such that when the time count value is less than the duty cycle value then a PWM signal is at a first logic level, otherwise the PWM signal is at a second logic level.

11. The method according to claim 10, wherein the first time count value is zero.

12. The method according to claim 10, wherein the first logic level is a logic "1" and the second logic level is a logic "0".

13. The method according to claim 10, wherein the first logic level is a logic "0" and the second logic level is a logic "1".

* * * * *